(12) United States Patent
Chang et al.

(10) Patent No.: US 10,903,199 B2
(45) Date of Patent: Jan. 26, 2021

(54) METHOD FOR DESIGNING VEHICLE CONTROLLER-ONLY SEMICONDUCTOR BASED ON DIE AND VEHICLE CONTROLLER-ONLY SEMICONDUCTOR BY THE SAME

(71) Applicant: HYUNDAI AUTRON CO., LTD., Seongnam-si (KR)

(72) Inventors: Jae-Ho Chang, Seoul (KR); Eun-Jung Kim, Seoul (KR); Jae-Woo Joung, Yongin-si (KR)

(73) Assignee: Hyundai Autron Co., Ltd., Seoul (KR)

( * ) Notice: Subject to any disclaimer, the term of this patent is extended or adjusted under 35 U.S.C. 154(b) by 0 days.

(21) Appl. No.: 15/389,131

(22) Filed: Dec. 22, 2016

(65) Prior Publication Data

US 2017/0103974 A1 Apr. 13, 2017

Related U.S. Application Data

(62) Division of application No. 14/961,342, filed on Dec. 7, 2015, now Pat. No. 10,748,887.

(30) Foreign Application Priority Data

Dec. 22, 2014 (KR) .......................... 10-2014-0186392

(51) Int. Cl.
| | |
|---|---|
| *H01L 25/00* | (2006.01) |
| *H01L 25/065* | (2006.01) |
| *G06F 30/39* | (2020.01) |
| *G06F 30/398* | (2020.01) |
| *H01L 21/78* | (2006.01) |

(52) U.S. Cl.
CPC .............. *H01L 25/50* (2013.01); *G06F 30/39* (2020.01); *G06F 30/398* (2020.01); *H01L 21/78* (2013.01); *H01L 25/0652* (2013.01); *H01L 25/0655* (2013.01); *H01L 2924/0002* (2013.01)

(58) Field of Classification Search
CPC ............. G06F 17/5081; G06F 17/5068; H01L 25/0652; H01L 2924/0002
See application file for complete search history.

(56) References Cited

U.S. PATENT DOCUMENTS

| | | |
|---|---|---|
| 6,415,416 B1 | 7/2002 | Fujiwara et al. |
| 6,536,028 B1 | 3/2003 | Katsioulas et al. |
| 9,432,298 B1 * | 8/2016 | Smith ................. H04L 49/9057 |
| 2003/0153105 A1 | 8/2003 | Burch |
| 2004/0222454 A1 * | 11/2004 | Kim ........................ H01L 21/04 257/313 |

(Continued)

*Primary Examiner* — Ahmed N Sefer
(74) *Attorney, Agent, or Firm* — Baker & Hostetler LLP; Hyunho Park

(57) ABSTRACT

The present invention relates to a method for designing a die-based vehicle controller-only semiconductor and a vehicle controller-only semiconductor manufactured by the same, and breaks the conventional semiconductor process to design and manufacture a novel conceptual vehicle controller-only semiconductor, EIP (ECU in Package), through a fusion of a new semiconductor process technique with a controller system technique, thereby obtaining an effect of capable of implementing a high performance/high quality semiconductor in micro-miniature size/ultra-light weight in a short time period.

6 Claims, 13 Drawing Sheets

(56) References Cited

U.S. PATENT DOCUMENTS

| | | |
|---|---|---|
| 2005/0289428 A1 | 12/2005 | Ong |
| 2006/0185429 A1 | 8/2006 | Liu et al. |
| 2006/0214288 A1 | 9/2006 | Ohsumi |
| 2006/0292752 A1 | 12/2006 | Connell et al. |
| 2007/0113126 A1* | 5/2007 | Ong .................. G11C 29/1201 714/724 |
| 2008/0113457 A1 | 5/2008 | Tsay et al. |
| 2008/0205172 A1 | 8/2008 | Xu |
| 2008/0278923 A1* | 11/2008 | Losavio ............. H01L 25/0657 361/803 |
| 2009/0045527 A1 | 2/2009 | Tsai |
| 2009/0102028 A1* | 4/2009 | Krishnan .............. H01L 21/561 257/666 |
| 2010/0031222 A1 | 2/2010 | Delp et al. |
| 2011/0006794 A1 | 1/2011 | Sellathamby et al. |
| 2012/0086050 A1 | 4/2012 | Bemanian et al. |
| 2012/0301977 A1* | 11/2012 | Andry ................ H01L 25/0655 438/14 |
| 2013/0010341 A1 | 1/2013 | Hagood et al. |
| 2013/0171777 A1 | 7/2013 | Grobelny et al. |
| 2013/0200429 A1 | 8/2013 | Pan |
| 2013/0207681 A1 | 8/2013 | Slupsky et al. |
| 2013/0210214 A1 | 8/2013 | Dallesasse et al. |
| 2013/0214386 A1 | 8/2013 | Xie et al. |
| 2013/0221542 A1 | 8/2013 | Chang et al. |
| 2014/0057373 A1 | 2/2014 | Golda et al. |
| 2014/0178565 A1* | 6/2014 | Drysdale ........... B29C 45/14639 427/8 |
| 2015/0143037 A1 | 5/2015 | Smith |
| 2017/0301388 A1 | 10/2017 | Lee et al. |

\* cited by examiner

<SPAS CONTROLLER>   <CONTROLLER AND
                      OUTER INSTRUMENT>

METHOD FOR DESIGNING VEHICLE CONTROLLER-ONLY SEMICONDUCTOR BASED ON DIE AND VEHICLE CONTROLLER-ONLY SEMICONDUCTOR BY THE SAME

PRIORITY

This application claims priority under 35 U.S.C. § 119 to Korean Patent Application No. 10-2014-0186392, filed on Dec. 22, 2014, entitled "Method For Designing Vehicle Controller-Only Semiconductor Based On Die And Vehicle Controller-Only Semiconductor By The Same," the contents of which are incorporated herein by reference.

CROSS REFERENCE TO A PARENT APPLICATION

The present application is a divisional application of U.S. patent application Ser. No. 14/961,342, filed on Dec. 7, 2015, the contents of which are incorporated herein by reference.

BACKGROUND

1. Technical Field

The present invention relates to a method for designing a die-based vehicle controller-only semiconductor and a vehicle controller-only semiconductor manufactured by the same, and more particularly, introduces a method for manufacturing a semiconductor under a novel concept, in which only key functionalities of chips are merged into a single system in early stages. Furthermore, the present invention describes an effect on developing a die-based integrated semiconductor and a future business prospect on the die-based integrated semiconductor, in terms of a novel semiconductor process technique which surpass a conventional semiconductor process and causes system techniques to be fused.

2. Description of the Related Art

In general, an Electronic Control Unit (ECU) are developed in a manner that several complete chips are integrated onto one board, in which, as recent demands on functionalities of vehicles continuously increase in terms of a convenience aspect and a variety aspect, an internal controller becomes complex and massive, thereby negatively affecting on a vehicle size and a fuel efficiency.

In response thereto, semiconductor makers have been developing a semiconductor where chips having many functionalities are integrated into a smallest possible size, thereby aiming at quickly implementing such functionalities. Especially, they progress toward the way to develop a single chip system in a manner that all functionalities of peripherals including a core are integrated into one integrated circuit.

This effort created a System-On-Chip (SOC) technique by which main functional units such as a power unit, a sensor, a driving unit, a calculation unit, and the like are assembled onto one single semiconductor chip. Also, when a certain applied function is not feasible only by a single chip, a System-In-Package (SIP) technique comes into the spotlight, in which several semiconductors are integrated by adding a special process manufactured semiconductor such as a communication unit, a memory and a core.

By the way, it needs to consider a business aspect such as a development effectiveness as to whether there is a need to continue a semiconductor business in implementing SOC-based or SIP-based chip functions conforming to a multi-function or multisystem. Especially, to handle the continuously grown ECU techniques with only an expensive software IP-based semiconductor design technique has a variety of limits such as a rise of development cost, a protraction of a development period, and a lack of semiconductor technique.

The followings are descriptions of the drawings relevant to a technique for developing a conventional semiconductor-based (SIP-based or SOC-based) ECU.

FIG. 1 is a view illustrating a conventional, complex and massive controller; FIG. 2 is a flowchart illustrating a conventional semiconductor development process and views showing respective steps of the process; FIG. 3 is views illustrating conventional SOC and SIP development schemes; FIG. 4 is views illustrating core chips, each of which constitutes the conventional controller; FIG. 5 is views illustrating power chips, each of which constitutes the conventional controller; FIG. 6 is views illustrating communication chips, each of which constitutes the conventional controller; and FIG. 7 is views illustrating a conventional smart parking assist system (SPAS) control and an outer instrument, respectively.

The key component playing a brain role of the ECU is a core semiconductor (see FIG. 4) and the other main semiconductors are a memory, a communication unit, a power unit, a sensor, an actuator semiconductor (see FIGS. 4 and 6), and the like.

A conventional semiconductor development method, as shown in FIG. 2, is to design a circuit based on a software semiconductor Intellectual Property (IP) in order of a semiconductor process assemble and then assemble a single chip system via a wafer manufacturing process.

The IP is a predefined functional block to be implemented in a semiconductor device, and has advantages that it enables a reuse of a semiconductor design to more quickly implement a complex circuit and facilitates designing a final product and assembly. However, it has disadvantages that it is very expensive and the current status is even technically dependent on an advanced semiconductor business.

Speaking of a difference between a SOC and a SIP in the conventional semiconductor process of FIG. 2, the SOC is manufactured in a way to implement and assemble several functions into a single designed circuit, whereas the SIP is manufactured in a way to integrate and package distinct semiconductor components processed through respective semiconductor processes onto a single chip.

Therefore, such SOC development schemes are on a single chip basis, such that the specification and the design may be optimized, thereby reducing the area, and an overall process may be simplified through a single process. Further, the SIP development scheme does not require a circuit design and verification process compared to the conventional semiconductor process since it reuses an already manufactured semiconductor die, and therefore, can reduce the development period (see FIG. 3).

Referring to FIGS. 1 through 7, the conventional, complex and massive ECU is an assembly of several semiconductors (SIPs or SOCs). In the ECU currently used in a vehicle, it becomes difficult to design as well as inevitable to increase a size and a weight thereof, because the number of semiconductors constituting it increases and a connection structure among chips becomes complicated as the functions and performance thereof are developed. These matters cause to degrade a spatial availability in an outer instrument enclosing such complex and massive ECU and increment a vehicle weight, and thus deteriorate even a fuel efficiency.

Further, as mentioned above in the difference between the SOC and the SIP, when developing the controller in a manner of manufacturing a single semiconductor through a circuit design of functional blocks, the SOC has problems in terms of the development effectiveness such as a cost and a period, as follows:

First, the development cost increases. The SOC is subject to a semiconductor design based on expensive IPs and thus incurs a burdensome initial development cost. Further, when constructing the ECU, identical function in the chips may be overlapped. In case where the whole ECU needs just one function but each SOC necessarily includes such a function such as a core or communication thereof, it wastes hardware resources and raises a cost price and a development cost.

Second, it takes a long time to development the SOC. Typically, in order to develop one semiconductor chip, several test processes such as a mask simulation, a verification of accuracy, and the like, is required until a final chip is completed. However, as the conventional ECU embeds several chips, the test is repeated over the chips and this leads to prolong the development period. Along with this, if function and performance on the already developed ECU should be further improved, the semiconductor process must be returned to an initial design stage. For example, even though merely a core was substituted among components constituting the SOC, the whole chip must be redesigned on a new core basis and the semiconductor manufacturing process and each test process step-by-step be passed. Therefore, the development period have no choice but to be prolonged.

Third, it is difficult to reuse the SOC. For a fixed chip which a designing, an assembling, and a verifying are finalized, the respective semiconductor components constituting that chip are unable to be reused. In particular, because the SOC is a single chip system where several functional components are intricately engaged, the chip is inoperative although just a processor was substituted or only some functions such as a communication and the like were changed. Therefore, even though a new component is inserted therein with bearing the prolongation of the development in mind, the existing, un-substituted components cannot be reused.

Fourth, there is an issue concerning software compatibility. When the controller is developed based on the conventional SOC chip, different software platforms and development environments are given by chip makers. On this account, in order to unify several chips at an controller level, the software compatibility should be considered. Accordingly, there is a cumbersomeness that one should set to fulfill the regulation for a chip-to-chip interface, develop a unified development environment (e.g., Configuration Tool, etc.), and verify a matching between the chips at the controller level.

SUMMARY

The present invention is devised to address the problems of the SOC development scheme described above, and provides a method for designing a die-based vehicle controller-only semiconductor and a vehicle controller-only semiconductor manufactured by the same.

A method for developing a die-based integrated semiconductor is based on the SIP development scheme described above. However, the SIP has disadvantages that it causes any problems such a heat radiation, an electromagnetic wave problem, and the like due to a chip-to-chip internal complex increase and thus its reliability may be degraded. In order to compensate for the disadvantages, a unified and optimized hardware design is very important.

Accordingly, the object of the present invention is to utilize the SIP development scheme capable of reusing the existing semiconductor die without the need of designing a circuit, bring the advantages of the SOC development scheme, i.e., semiconductor miniaturization and process simplification, and, as a result, implement an integrated semiconductor of high performance/quality in short time period/micro-miniature size/ultra-light weight through the design and manufacturing of a new conceptual EIP.

An aspect of the present invention is to provide a method for designing a die-based EIP, including: (a) classifying common functions of a plurality of dies having used in an Electronic Control Unit (ECU); and (b) passing through a pattern design process such that the plurality of dies having the classified common functions is operable in a single chip and then integrating the plurality of dies into the single chip.

At this time, it is preferable to after step (a), further include building the plurality of dies having the classified common functions into a database and storing and managing them therein.

Preferably, in step (b), the single chip may be integrated using a wire bonding and a molding technique.

Preferably, in step (b), the single chip may be unified by a first process of cutting a wafer into a predetermined size; a second process of integrating circuits having a number of functions onto surfaces of wafer pieces cut in the first process to produce the plurality of dies; and a third process of taking at least one die having common functions in the plurality of dies produced in the second process to make one single chip by using a pattern design, a wire bonding and a molding technique.

Preferably, in step (a), the plurality of dies having the common functions may consist of a power chip, a communication chip, a core chip, and a memory chip.

Preferably, after step (b), the method further includes unifying and verifying a software platform and an application into the unified single chip.

Preferably, software unified in the single chip may consist of a standard basic platform and application software.

A second aspect of the present invention is to a method for designing a vehicle controller-only semiconductor, wherein circuits having a number of functions are integrated onto surfaces of wafer pieces cut in a regular size to manufacture a plurality of dies, and, thereafter, wherein at least one die having common functions in the manufactured dies is pattern-designed to be unified into a single chip.

At this time, it is preferable to further include, prior to the pattern designing, building the plurality of dies having the common functions into a database and storing and managing them therein.

Preferably, the single chip may be unified using a wire bonding and a molding technique.

Preferably, the plurality of dies having the common functions may consist of a power chip, a communication chip, a core chip, and a memory chip.

Preferably, the method further includes a process for unifying and verifying a software platform and an application into the unified single chip.

Preferably, software unified in the single chip may consist of a standard basic platform and application software.

A third aspect of the present invention is to provide a die-based vehicle controller-only semiconductor, wherein circuits having a number of functions are integrated onto surfaces of wafer pieces cut in a regular size to manufacture a plurality of dies, and at least one die having common functions in the manufactured dies is pattern-designed to be unified into a single chip.

At this time, it is preferable to unify the single chip using a wire bonding and a molding technique.

Preferably, the plurality of dies having the common functions may consist of a power chip, a communication chip, a core chip, and a memory chip.

Preferably, the die-based vehicle controller-only semiconductor is manufactured by unifying and verifying a software platform and an application into the unified single chip.

Preferably, software unified in the single chip consists of a standard basic platform and application software.

As described above, a method for designing a die-based vehicle controller-only semiconductor according to the present invention can implement an EIP of micro-miniature size/ultra-light weight in a low-price/high performance/high quality in a short time period. The effects in this connection will be described in detail as follows.

The present invention can save the development cost through the reuse of hardware and a die-based integrated design, compared to a conventional, expensive IP-based designing scheme. That is to say, compared to the conventional dozens to tens of billions IPs, a die-based scheme saves development efforts because it is a key technique in which such IP technique is inherent and a product is delivered at a unit cost reflecting only a die processing in the conventional semiconductor manufacturing process. According to the present invention, the die-base EIP has the advantage that it can be reused in a general purpose. The EIP, which integrates key functional dies for communication, powering, memory, and the like, is needed in most controllers, and thus is generally applicable to all controllers. In addition, by combining it with a specific sensor, an actuator and the like, it is possible to convert such controller into any specific controller used for a SMK, a TPMS, etc.

Further, in view of a finished controller system, it enables a hardware reuse together with a cost reduction. The EIP under the die-based integrated designing is designed to optimize the EIP considering a die-to-die connectivity to be implemented on one board in a minimum size. Therefore, applying such EIP on behalf of pre-existent chips in the conventional controller can prevent hardware from unnecessarily overlapping between chips to avoid a hardware waste and save a PCB.

The controller where the EIP is applied has advantages that an extra space is made in the outer instrument enclosing the controller and thus the outer instrument may be reused as well as a whole size of the controller also decreases.

According to the present invention, the EIP development scheme has advantages that it introduces weight lightening, thinning, shortening, and miniaturizing of the controller and the quality improvement. The EIP which is a key die-based integrated system includes only constitutive dies and components necessary to connect each other, and as a result, its design is simplified and the number of the components and a total of weight and the whole size decrease. Therefore, the EIP has advantages that it can improve an EMC protection between the respective components and a quality of the controller, and also improve an entire fuel efficiency of a vehicle owing to the downsizing of the controller and the reduction of the outer instrument (see FIG. 17).

According to the present invention, the EIP is a single chip system where a standard platform is applied and has an advantage that it supports any software. Therefore, it does not need to keep different platforms and interfaces among the conventional chips in mind. Since it operates on a common standard platform basis, it can quickly implement a required application software and a specific function although it is used as another controller, it has another advantage that it may configure an easy operating environment through a standard interface between EIPs.

According to the present invention, the EIP is a new system in which fuses an integrated die-based semiconductor process technique under a novel concept with the platforms and the test techniques owned by the existing component makers, and can be said to be an important key for taking the lead in the field of vehicle electronic control for the future.

DETAILED DESCRIPTION

Hereinafter, embodiments of the present invention will be described in detail with reference to the accompanying drawings. It should be understood that the present invention is not limited to the following embodiments, and that the embodiments are provided for illustrative purposes only. The scope of the invention should be defined only by the accompanying claims and equivalents thereof.

An ECU In Package (EIP) called in the present invention connotes that the new semiconductor process technique and a system technique are fused in a meaning that all functions of a controller are unified into one package. Accordingly, such core techniques may be a system technique fused into a complete semiconductor together with a die-based semiconductor integrated design and a new conceptual semiconductor process technique.

Figure 1:
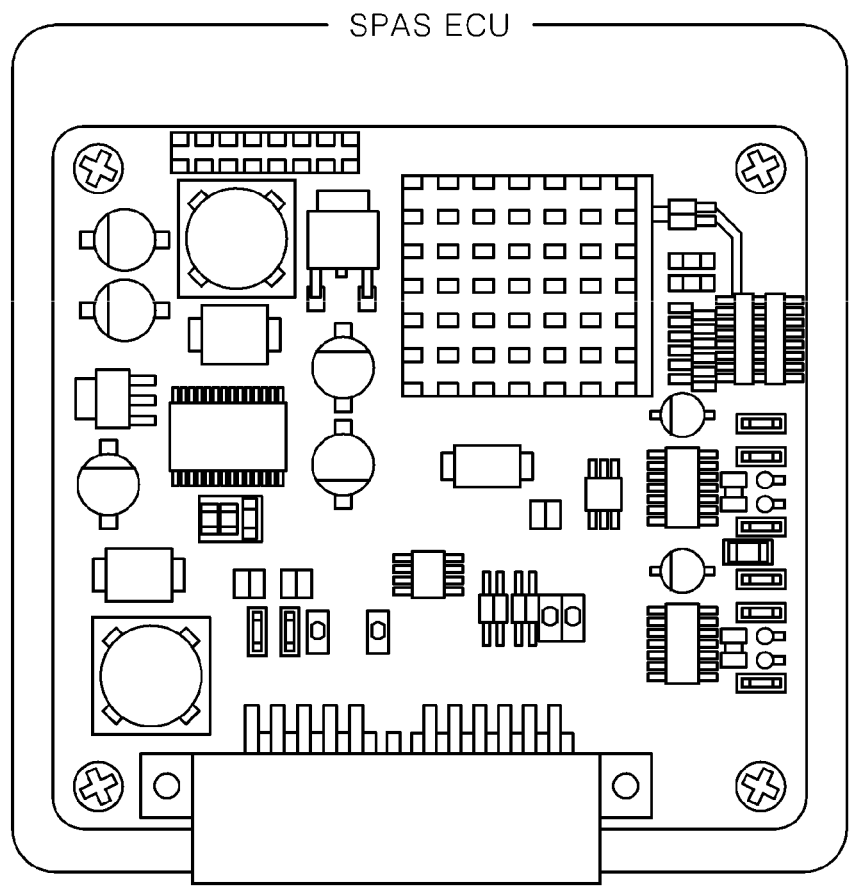
FIG. 1 is a view illustrating a conventional, complex and massive controller.
Figure 2:
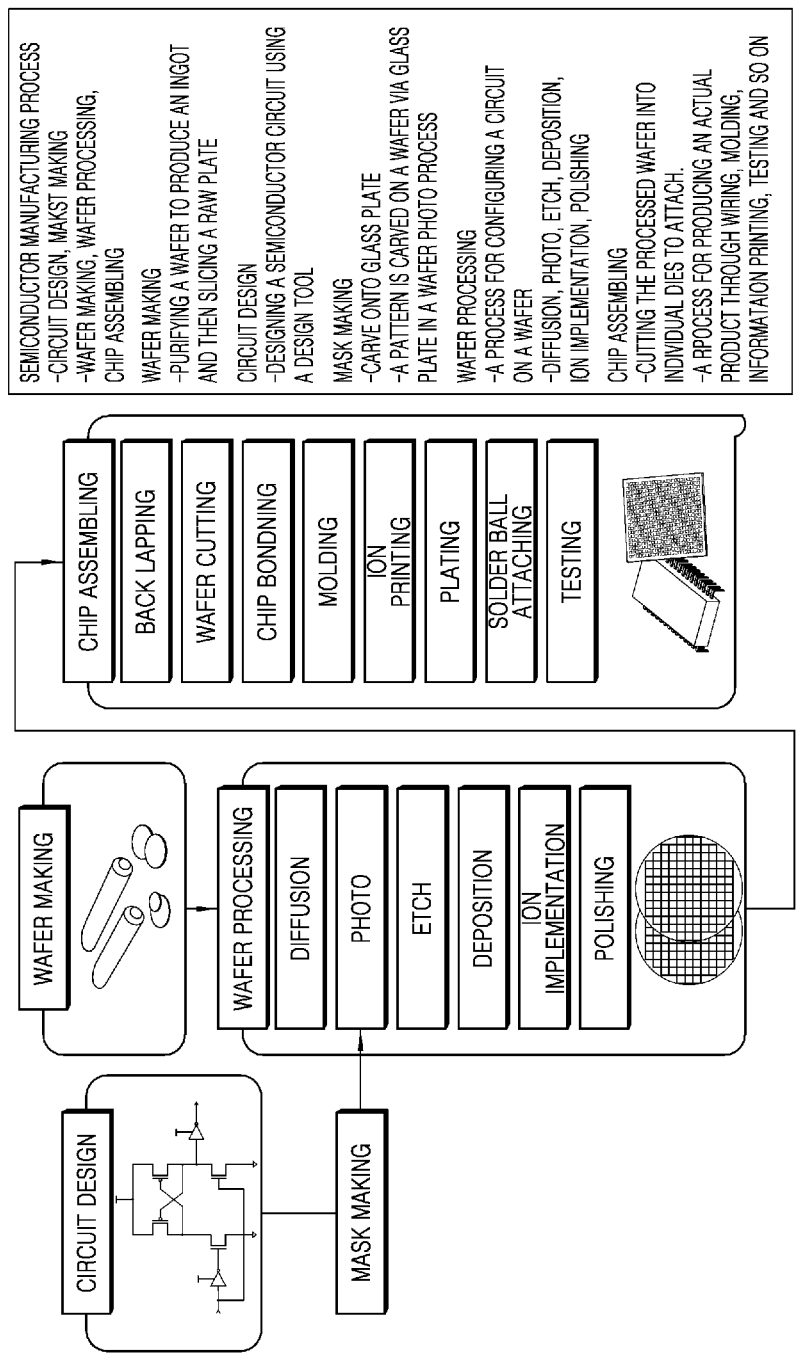
FIG. 2 is a flowchart illustrating a conventional semiconductor development process and views showing respective steps of the process.
Figure 3:
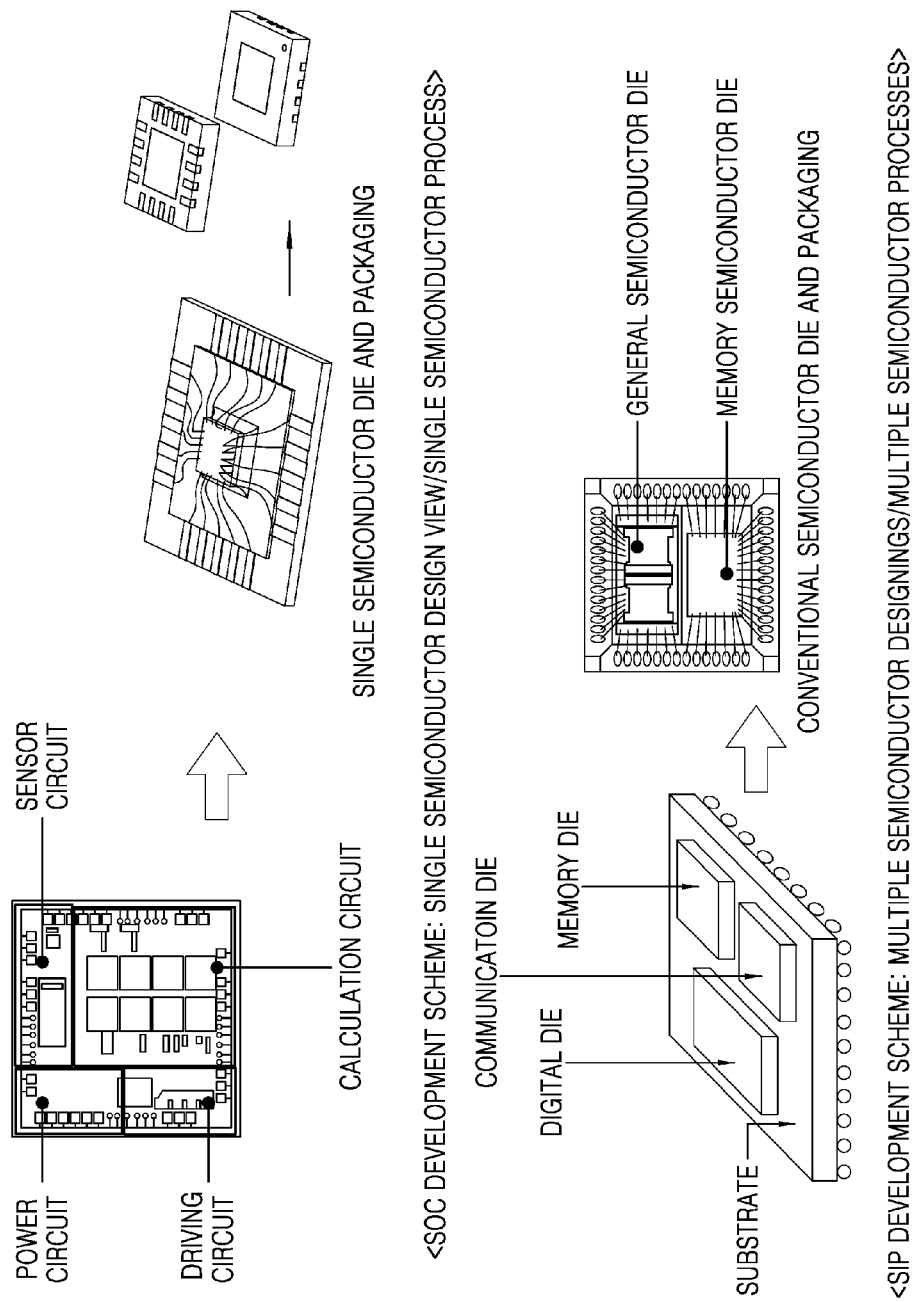
FIG. 3 is views illustrating conventional SOC and SIP development schemes.
Figure 4:
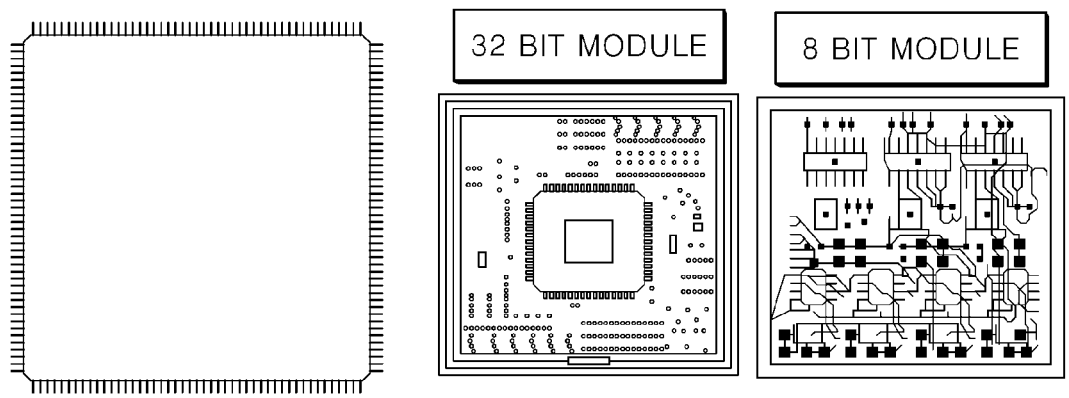
FIG. 4 is views illustrating core chips, each of which constitutes the conventional controller.
Figure 5:
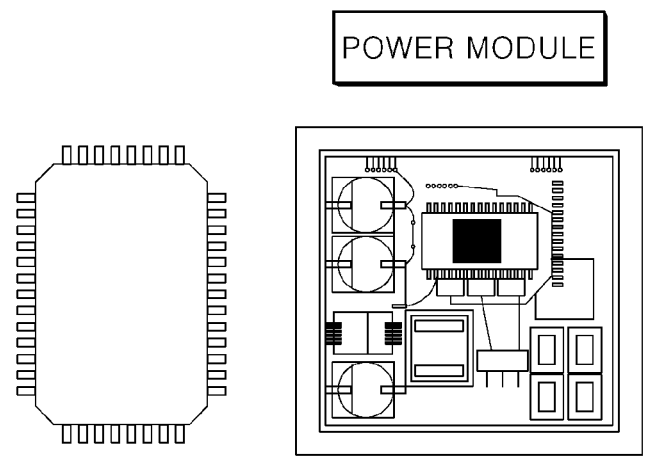
FIG. 5 is views illustrating power chips, each of which constitutes the conventional controller.
Figure 6:
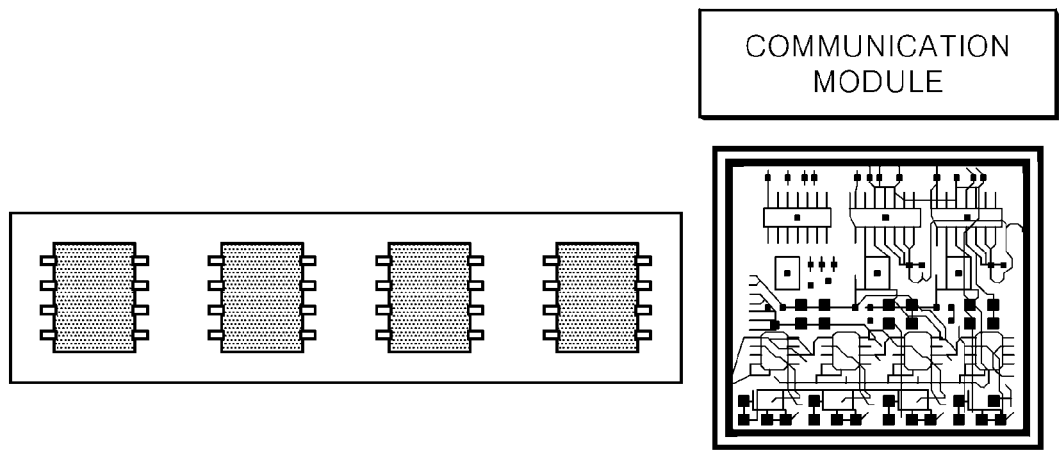
FIG. 6 is views illustrating communication chips, each of which constitutes the conventional controller.
Figure 7:
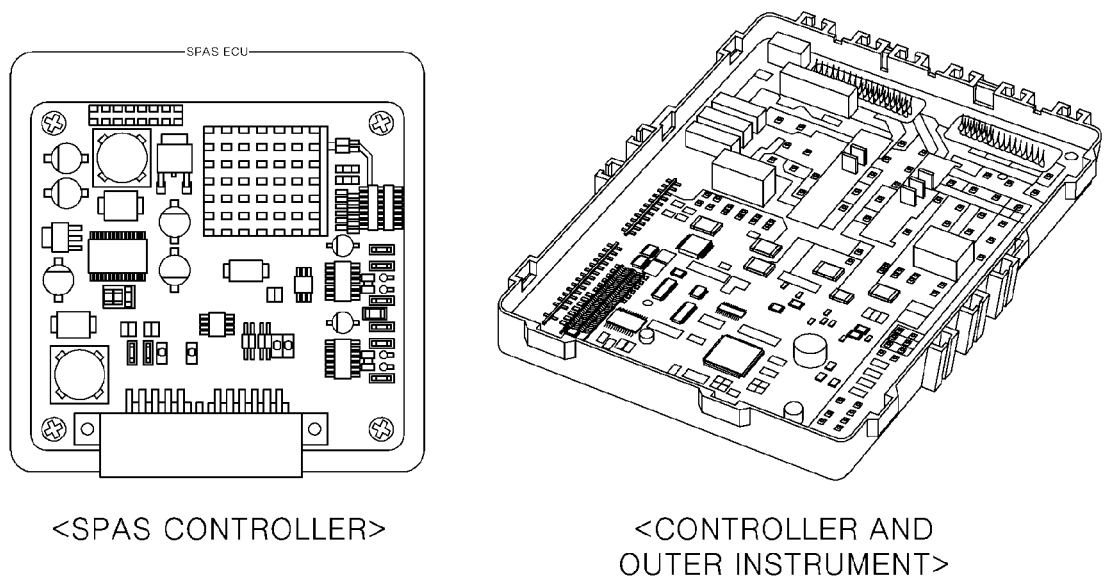
FIG. 7 is views illustrating a conventional smart parking assist system (SPAS) control and an outer instrument, respectively.
Figure 8:
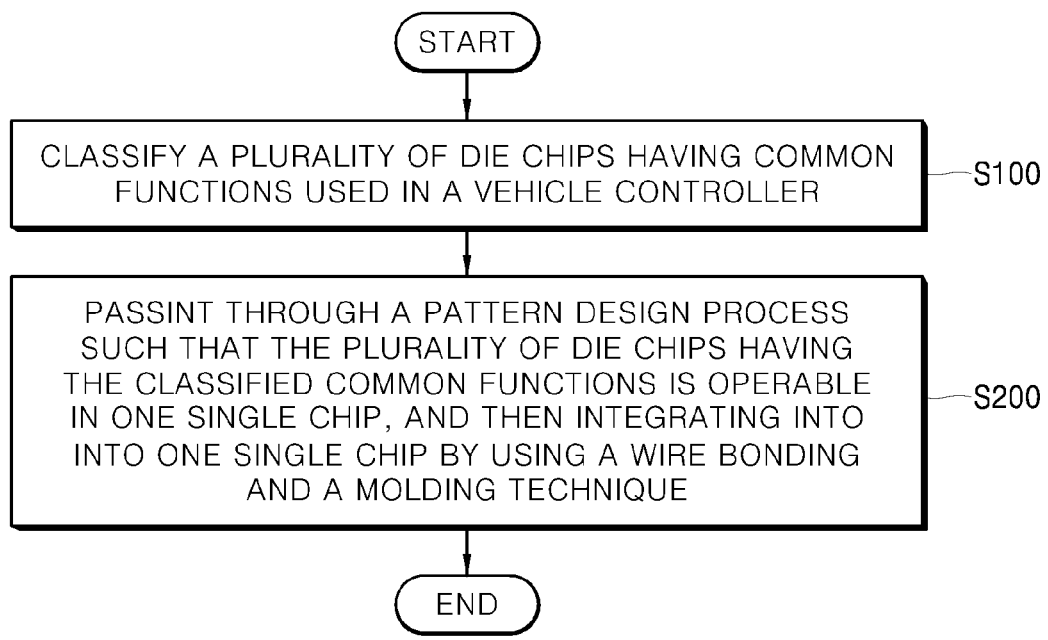
FIG. 8 is an overall flowchart of illustrating a method for designing a die-based EIP according to an embodiment of the present invention.
Figure 9:
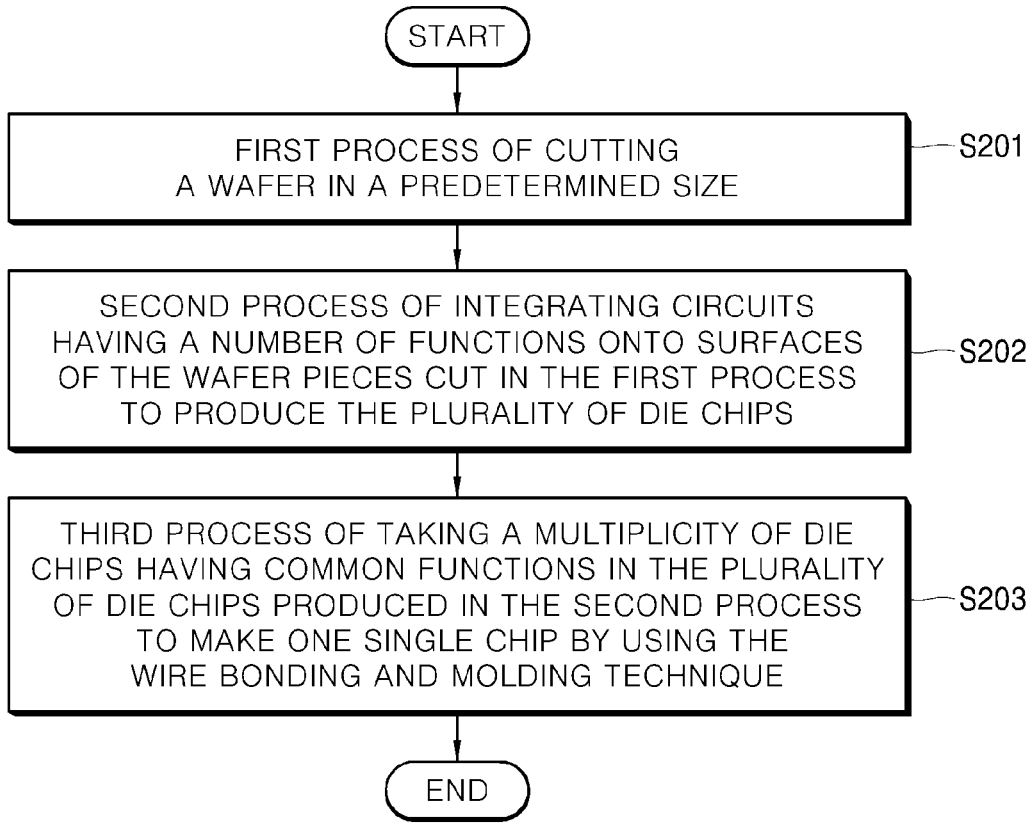
FIG. 9 is a flowchart for explaining a method for manufacturing the die-based EIP according to an embodiment of the present invention.

First of all, referring to FIGS. 8 and 9, a plurality of dies (preferably, a power chip, a communication chip, a core chip, a memory chip, and the like) having main common functions to be used in the ECU is classified (S100).

That is to say, if the dies having the main common functions (e.g., power, communication, core, memory, etc.) used in the ECU are classified and then are built into a database, they are able to be reconstructed based on EIP characteristics desired to be implemented. Further, an EIP where dies commonly used in separate EIPs is unified acts as one for the common functions and thus can be applied and reused in another controller through the software compatibility. On the other hand, components which cannot be unified by the common functions (i.e., physically irreducible components for some reasons such as the heat radiation and the like) can separately be managed. And, the plurality of dies having the common functions classified in step S100, for example, may preferably be built into the database through a manager terminal and stored and managed in a distinct server, storage medium, or the like.

The following components are chips, having main common functions, existent in the respective controllers, and can be designed as an EIP based on dies corresponding to the respective chips in future.

First, the power chip is a component which stabilizes a power fluctuant according to a state of a vehicle, and a component which reduces and provides the power to another component.

Second, the communication chip is a component required for the communication with the other controller in a vehicle (e.g., CAN, LIN, K-Line, FlexRay, MOST, Ethernet, and the like).

Third, the core chip is a component (8 bit/32 bit microcontroller) which can be programmed with respect to operations of the ECU.

Fourth, the memory chip is a component capable of storing techniques or requirements with respect to the operations of the ECU.

Next, the plurality of dies having the common functions classified in step S100 passes through a pattern design process such that the plurality of dies having the common functions classified in step S100 is operable in one single chip, and then is integrated into one single chip by using a wire bonding and a molding technique (S200).

In addition, after the step S200, a step of unifying a software platform and an application into the unified single chip and verifying this may be further included.

In the step S200, as shown in FIG. 9, the one single chip may be manufactured by a first process of cutting a wafer into a predetermined size (S201), a second process of integrating circuits having a number of functions onto surfaces of the wafer pieces cut in the first process (S201) to produce the plurality of dies (S202), and a third process of taking at least one die having common functions in the plurality of dies produced in the second process (S202) to make one single chip by using the wire bonding and molding technique (S203).

The first process (S201) is the wafer process. The wafer is a material for making an integrated circuit, formed by purifying and slicing a silicone (Si) at a thickness of hundreds µm (1 µm=1/1000 mm), wherein the integrated circuit is manufactured on the sliced surface. Typically, a number of integrated circuits may be produced from a sheet of the wafer. In order to increase the number of chips obtainable from a sheet of the wafer when manufacturing chips based on the integrated circuit, it is needed to downsize the chips or upsize the wafer.

The second process (S202) is the die process. The die is a rectangular piece of the semiconductor material prepared by cutting the wafer and may be considered to be the critical element of the semiconductor since a circuit is configured thereto. Assuming the SOC designed and manufactured based on expensive software IPs, the die may be an interim product of the SOC, which several IPs are reflected into, and the EIP is developed based on such critical die.

Figure 10:
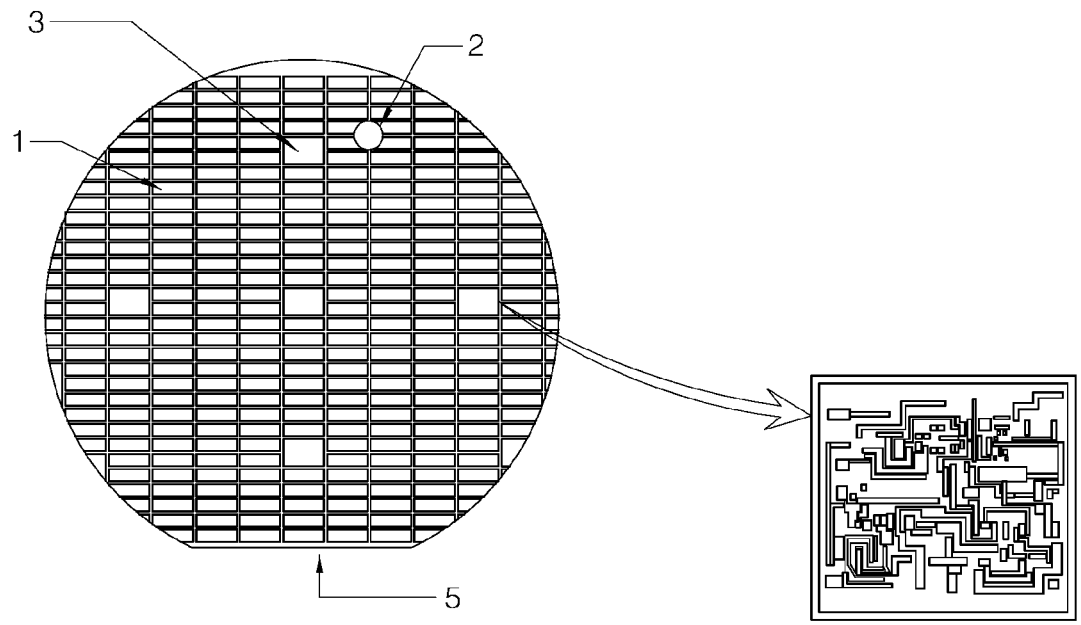
FIG. 10 is views illustrating a product of a wafer process and a die process in the method for manufacturing the die-based vehicle controller-only semiconductor according to an embodiment of the present invention.
Figure 11:
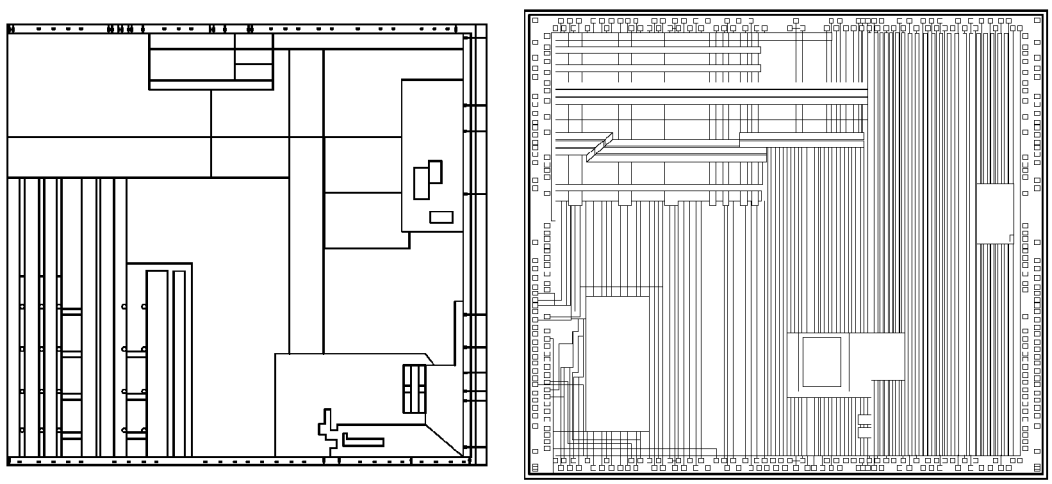
FIG. 11 is views illustrating a core die produced via a die process in the method for manufacturing the die-based vehicle controller-only semiconductor according to an embodiment of the present invention.
Figure 12:
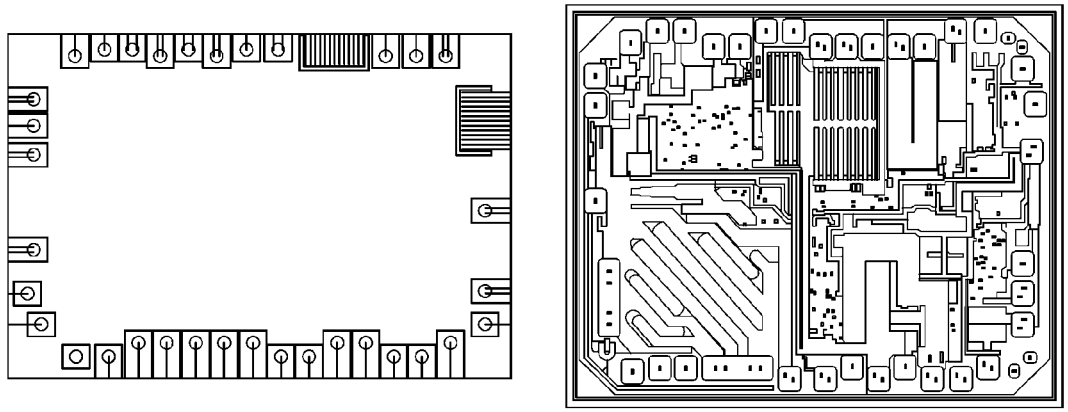
FIG. 12 is views illustrating a power die produced via a die process in the method for manufacturing the die-based vehicle controller-only semiconductor according to an embodiment of the present invention.
Figure 13:
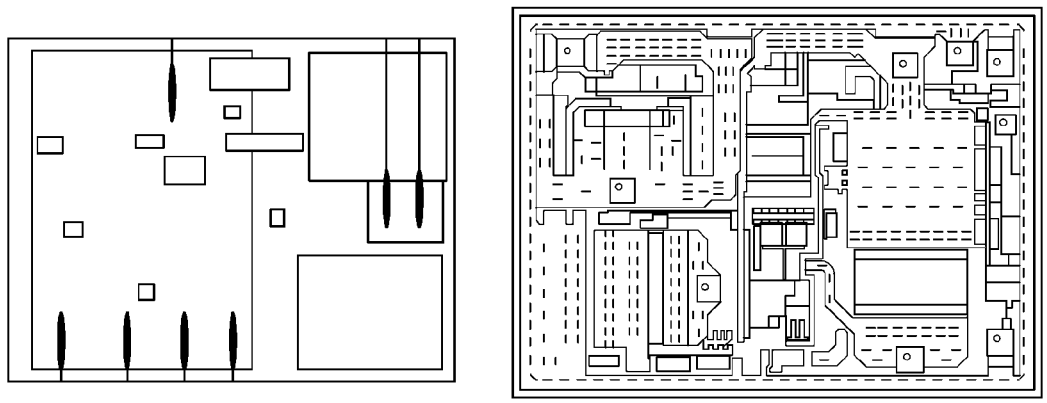
FIGS. 13 and 14 are views illustrating communication dies produced via a die process in the method for manufacturing the die-based vehicle controller-only semiconductor according to an embodiment of the present invention.
Figure 14:
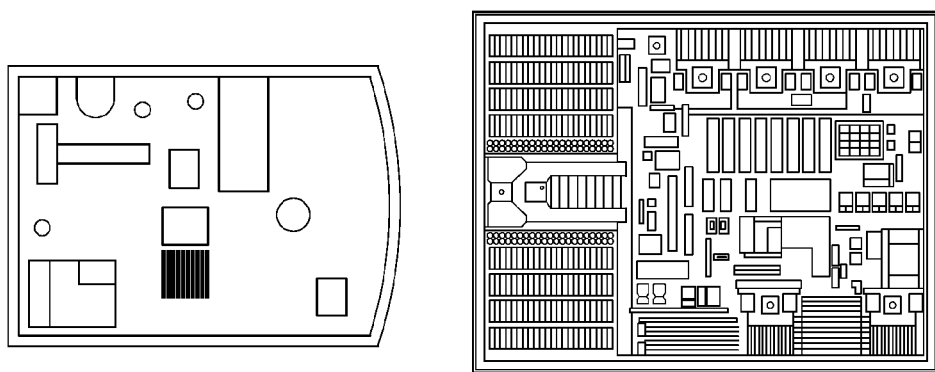

FIG. 10 is views illustrating a product of a wafer process and a die process in the method for manufacturing the die-based vehicle controller-only semiconductor according to an embodiment of the present invention; FIG. 11 is views illustrating a core die (e.g., Infineon 32 bit bare die/TC275T) produced via a die process in the method for manufacturing the die-based vehicle controller-only semiconductor according to an embodiment of the present invention; FIG. 12 is views illustrating a power die (e.g., Infineon/TLE7368) produced via a die process in the method for manufacturing the die-based vehicle controller-only semiconductor according to an embodiment of the present invention; and FIGS. 13 and 14 are views illustrating communication dies (Microchip/MCP2562, Microchip/MCP2003) produced via a die process in the method for manufacturing the die-based vehicle controller-only semiconductor according to an embodiment of the present invention.

The third process (S203) is an EIP process. It is the same as the conventional SOC process in view of the concept that several functional blocks are unified into one single chip system, but is different from the conventional SOC in the fact that, other than intellectual software functional module and the IP-based design, a die verified its own reliability after processing the wafer is designed and unified in hardware.

This process technique is not a method beginning from the IP-based software design to finally assemble a chip such as the conventional semiconductor manufacturing process but is a new controller-only semiconductor process design technique in which the dies produced from the previously processed wafer are designed and unified in hardware to operate on a single chip.

The above-described semiconductor process technique is a hardware design technique unifying several functional dies such as the communication die, the power die, the memory die, and the like into one chip, whereas the system technique is software applied to the semiconductor and a technique of unifying and estimating it. The software applied to the semiconductor includes a standard basic platform and application software, and the estimation includes areas of verifying the unification with hardware and finally the functions of the system.

Figure 15:
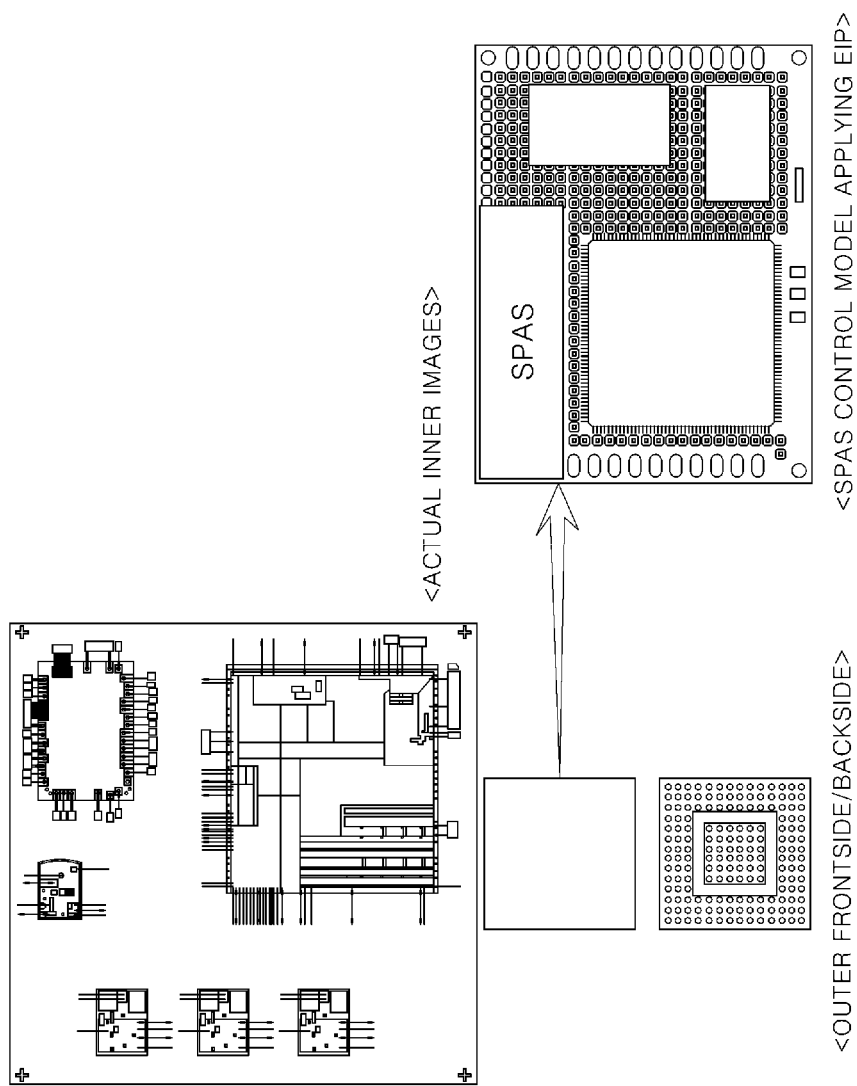
FIG. 15 is views illustrating an inside and an outside of an EIP module, and a SPAS controller model where such EIP is applied, according to an embodiment of the present invention.
Figure 16:
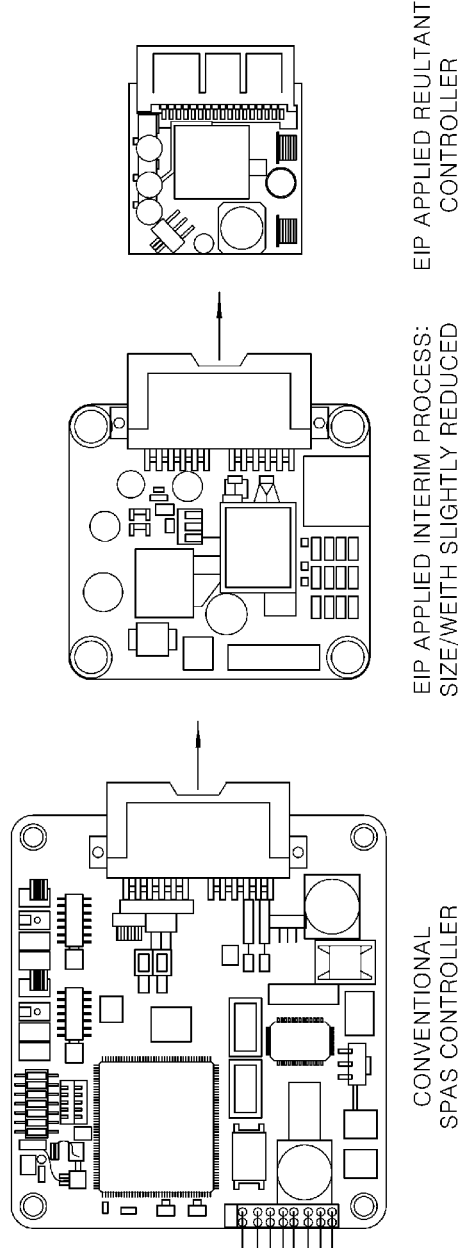
FIG. 16 is views illustrating actual samples, each of which the EIP module is applied to a controller, according to an embodiment of the present invention.
Figure 17:
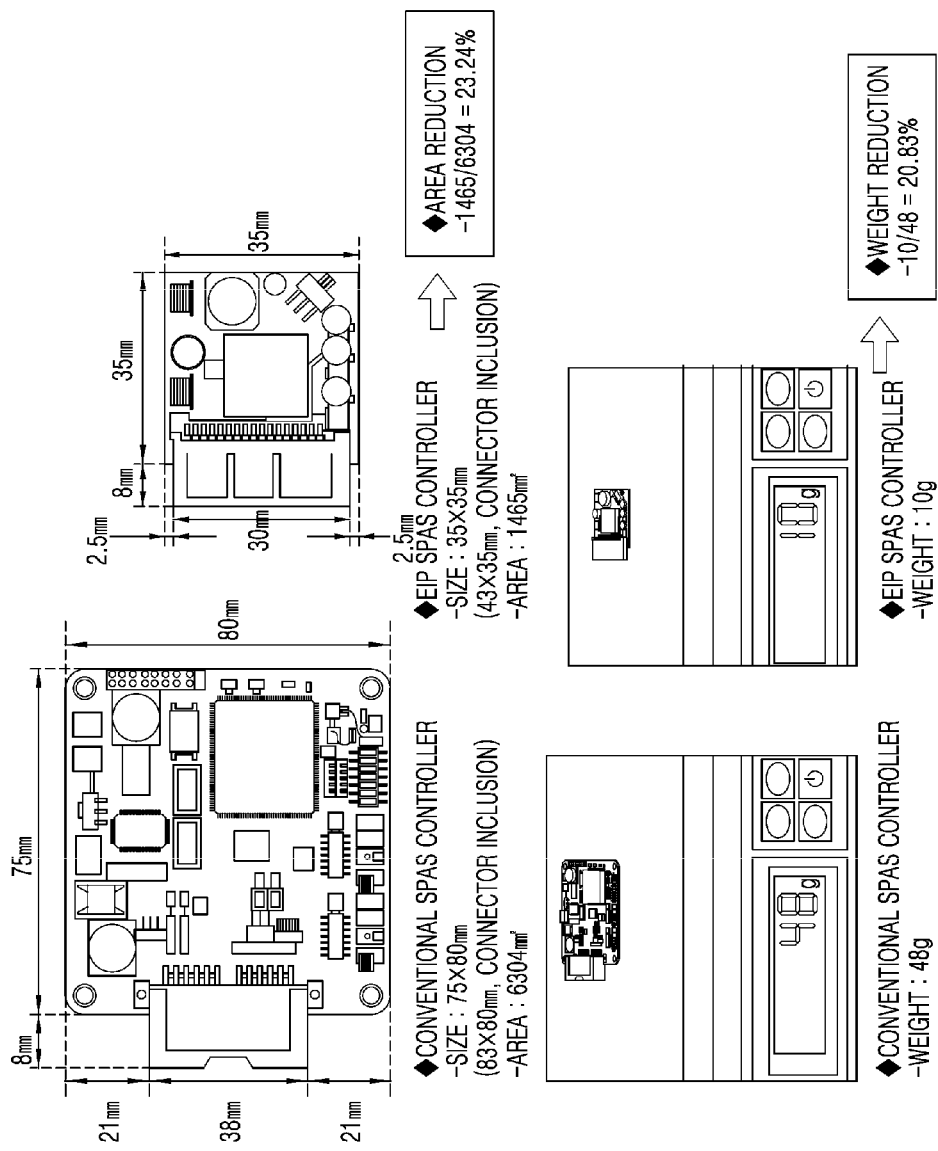
FIG. 17 is actual images showing effects of a scaling down and a weight reduction on the SPAS controller which the die-based EIP module is applied to, according to an embodiment of the present invention.

Accordingly, when the software platform and the application are unified into the complete hardware chip and then the last verifying step is completed, one seemingly simple chip as the fusional and complex technical result can substitute the conventional, complex and massive controller. Referring to the relevant drawing, FIG. 15 is views illustrating an inside and an outside of an EIP module, and a SPAS controller model where such EIP is applied, according to an embodiment of the present invention; and FIG. 16 is views illustrating actual samples, each of which the EIP module is applied to a controller, according to an embodiment of the present invention.

The present invention suggests a semiconductor designing method which breaks the conventional development scheme integrating several chips into the ECU and unifies to enable the functions of the several chips to be operable in one single chip.

Such unified semiconductor is of a form of a single chip designed and manufactured by unifying the functions constituting a controller and can be substituted with the ECU because its inner functions can perform the same role as the SPAS, TPMS, and the like although its appearance appears a semiconductor chip. Accordingly, it is referred to a controller dedicated semiconductor for a controller such as the SPAS or the TPMS and the present invention defines such controller dedicated semiconductor as the EIP.

Meanwhile, for the conventional chip constituting the ECU, because an IP-based software design is first processed prior to the semiconductor manufacturing process. Therefore, in case where a chip needs to be changed or modified to be the other use's chip, the already prepared chip should be discarded and the whole process should restarted from an initial design up to the semiconductor process and the verification process.

Of course, the verification process for the reliability of each of the dies unified in the EIP according to the present invention is needed. However, compared to the process cost injected into the chips of the conventional controller and the verification period for the respective steps, the die passing the reliability verification can immediately be applied to the EIP, thereby drastically decreasing a time-to-market of the controller. Further, coupling a specific functional sensor, actuator, or the like with the common functional EIP, such as reusing the EIP in the present invention, enables the EIP to be quickly converted to one for any specific controller, thereby move an opportunity of mass production forward.

The conventional ECU could not be reduced any more although there is a common component among the chips because it is configured on a fixedly assembled semiconductor chip basis. In addition, it should be considered that as the number of inner chips gets larger due to the increase in the number of the controller functions, the design becomes more complex and the size and the weight becomes larger.

By contrast, because the EIP according to the present invention is a system unified into one chip based on a critical die of a semiconductor, merely components required to connect dies are used and thus its design is simplified as much and the number of the components and the weight and size can also decrease. As a result, the present invention can improve an EMC protection between the respective components and a quality of the controller, as a side effect, the entire fuel efficiency of the vehicle and the spatial availability in the outer instrument of the controller can also be improved by the weight lightening and downsizing of the controller. In addition, a platform including a driver provided from each semiconductor maker, and a software development environment are different by the semiconductor makers, thereby reaching a deadlock in unifying software. However, because the EIP of the present invention is the single chip system where functional dies required for the controller are unified and a standard platform is applied, it is not required to consider different platforms and interfaces among the conventional chips. Further, because the EIP of the present invention operates on a shared standard platform basis, it can quickly implement application software and specific functions, and has a high compatibility with software between EIPs through the standard interface.

Further, if a die-based integrated design method is standardized and the semiconductor manufacturing process and the estimation technique go into mass-production orbit, the competition between semiconductor makers for seeking to sell dies is expected to accelerate. Therefore, instead of chips reflecting expensive IP cost, the cheaper dies come into the market and a die provision system is formed on a Tier1 leading EIP business and component makers.

That is to say, a company holding the EIP technique may choose a die providing business applied by each EIP and secure the right to buy an unified semiconductor through a transaction activation with the designated business. Such a paradigm introduced into a way to buy the semiconductor is expected to emerge as a new semiconductor development strategy among vehicle component makers and semiconductor businesses.

As such, the advent of the EIP can enhance the development efficiency by implementing a high performance/high quality semiconductor in micro-miniature size/ultra-light weight in a short time period (time-to-market enhancement) and allows counteracting the rapidly changing semiconductor technique. Furthermore, if a hardware design method is standardized and the EIP such as SPAS, TPMS, or the like is thereby manufactured, it is expected to have a profound effect on the upsweep of the future semiconductor business.

In conclusion, the EIP according to the present invention is a new technical model where a die-based unifying semiconductor process technique, the platform, and the estimation technique are fused, and it can lead the field of developing a vehicle semiconductor.

The present invention proposes one aspect for a novel conceptual EIP on a die basis in developing a vehicle controller-only semiconductor, and another aspect for avoiding the confliction with the other businesses trying to emulate the EIP technique and buy dies as a die provision business designation and a die unifying purchase.

Although preferred embodiments of a method for designing a die-based vehicle controller-only semiconductor and a vehicle controller-only semiconductor manufactured by the same have been described, the present invention is not limited thereto and may be variously practiced within the scope of the claims, the detailed description, and the accompanying drawings, which falls also within the present invention.

What is claimed is:
1. A method for designing a die-based vehicle controller-only semiconductor, the method comprising:
 (a) manufacturing a plurality of dies using a wafer and classifying the plurality of dies based on common functions of Electric Control Unit (ECU)s of a vehicle, wherein a functional circuit of each of the plurality of dies is capable of performing at least one of the common functions of the ECUs such that an ECU in

Package (EIP) of the vehicle is a die-based EIP and the common functions of the ECUs of the vehicle are unified in the EIP;

(b) constructing a design of the classified dies having at least one of the common functions of the ECUs of the vehicle into a database, storing the design of the classified plurality of dies in a storage medium, and reconstructing the design of the classified plurality of dies based on characteristics of the EIP;

(c) processing a pattern design and manufacturing a single chip to integrate the plurality of dies into the single chip based on the reconstructed design of the classified plurality of dies such that each of the classified plurality of dies having common functions is operable in the single chip via wire bonding and molding; and (d) operating each of the classified plurality of dies using the single chip via the EIP of the vehicle.

2. The method according to claim 1, wherein in step (c), the single chip is integrated using a wire bonding and a molding technique.

3. The method according to claim 1, wherein in step (c), the single chip is manufactured by:

a first process of cutting a wafer into a predetermined size;

a second process of integrating circuits having a number of functions onto surfaces of wafer pieces cut in the first process to produce the plurality of dies; and a third process of taking at least one die having common functions in the plurality of dies produced in the second process to make one single chip by using a pattern design, a wire bonding and a molding technique.

4. The method according to claim 1, wherein in step (a), the plurality of dies having common functions consists of a power chip, a communication chip, a core chip, and a memory chip.

5. The method according to claim 1, wherein after step (c), further comprising:

unifying a software platform and an application into the unified single chip; and verifying the software platform and the application that are unified in the single chip.

6. The method according to claim 5, wherein software unified in the single chip consists of a standard basic platform and application software.

* * * * *